(12) United States Patent
Ezekwe

(10) Patent No.: US 8,633,687 B2
(45) Date of Patent: Jan. 21, 2014

(54) HALL EFFECT SENSOR WITH REDUCED OFFSET

(75) Inventor: Chinwuba David Ezekwe, Albany, CA (US)

(73) Assignee: Robert Bosch GmbH, Stuttgart, DE (US)

(*) Notice: Subject to any disclaimer, the term of this patent is extended or adjusted under 35 U.S.C. 154(b) by 432 days.

(21) Appl. No.: 12/974,239

(22) Filed: Dec. 21, 2010

(65) Prior Publication Data

US 2012/0153945 A1  Jun. 21, 2012

(51) Int. Cl.
*G01R 33/06* (2006.01)
(52) U.S. Cl.
USPC ........................... 324/251; 324/207.2
(58) Field of Classification Search
USPC ................................. 324/251, 207.2
See application file for complete search history.

(56) References Cited

U.S. PATENT DOCUMENTS

| | | | |
|---|---|---|---|
| 5,406,202 A * | 4/1995 | Mehrgardt et al. | ........... 324/251 |
| 6,064,202 A | 5/2000 | Steiner et al. | |
| 7,492,149 B2 * | 2/2009 | Motz et al. | ................. 324/207.2 |
| 2003/0102909 A1 | 6/2003 | Motz | |
| 2009/0009164 A1 | 1/2009 | Utsuno | |

FOREIGN PATENT DOCUMENTS

DE   102006059421 A1   1/2008

OTHER PUBLICATIONS

International Search Report and Written Opinion in corresponding international application (i.e., PCT/US2011/064294), completed Feb. 6, 2012 (12 pages).
Randejovic et al., "Highly Sensitive Hall Magnetic Sensor Microsystem in CMOS Technology," Feb. 2002, IEEE Journal of Solid-State Circuits, vol. 37, No. 2, pp. 151-159, Switzerland, IEEE (9 pages).
Petoussis, et al., "A Novel Hall Effect Sensor Using Elaborate Offset Cancellation Method," Sensors & Transducers, vol. 100 Issue 1 (2009) 85-91 (7 pages).

* cited by examiner

*Primary Examiner* — Reena Aurora
(74) *Attorney, Agent, or Firm* — Maginot, Moore & Beck

(57) ABSTRACT

A Hall element sensor circuit in one embodiment includes a Hall element, a Hall element source, a switch matrix operatively connected to the Hall element and the Hall element source to establish a spinning current in the Hall element and to receive a Hall element signal from the Hall element based upon the spinning current, a front end amplifier including a first input operatively connected to a first switch matrix output and a second input operatively connected to a second switch matrix output, and at least one voltage source operatively connected to the front end amplifier at a location in the Hall element sensor circuit between the switch matrix and the front end amplifier.

13 Claims, 4 Drawing Sheets

HALL EFFECT SENSOR WITH REDUCED OFFSET

BACKGROUND

The invention relates to magnetic field sensors and more specifically to Hall Effect sensors.

BACKGROUND

Hall Effect sensors are among the most widely used magnetic sensors. Hall Effect sensors incorporate a Hall Effect plate, which is either an n- or p-doped area, supplied with bias current/voltage. In presence of a magnetic field the carriers that are moving in the doped area are deflected by the Lorentz force, and a Hall electrical field appears. The Hall voltage ($V_h$) appears across the positive and negative contacts of the Hall effect plate. Front-end circuitry provided with the sensor converts the Hall voltage to a data indicative of the sensed magnetic field.

An ideal Hall element when biased with a current thus generates a Hall voltage that is proportional to the product of the bias current and the applied magnetic field. In practice, fabrication imperfections and environmental conditions such as temperature and stress give rise to an additional voltage referred to as an "offset voltage" ($V_{os}$). The presence of the $V_{os}$ compromises the accuracy of the magnetic field measurement obtained by the Hall element.

One technique which has been developed to reduce the effects of the $V_{os}$ is a "spinning current" technique. This technique involves sequentially biasing a Hall element through its different bias states. By repeating the sequential biasing indefinitely, the magnetic field dependent voltage is modulated to a high frequency while the $V_{os}$ is established as a DC value. Alternatively, the $V_{os}$ is modulated to a high frequency while the magnetic field dependent voltage is established as a DC value. In either event, because the two voltages are separated by frequency, the desired signal may be recovered in either the analog or digital domain by demodulation and filtering.

While the spinning current technique is generally effective, some limitations are encountered. For example, the magnitude of the $V_{os}$ is several orders of magnitude larger than the maximum magnitude of the desired signal. Consequently, current spinning results in a small AC signal, representing the desired signal, riding on top of a large DC signal or offset.

The large DC offset places a heavy burden on the front end amplifier used to amplify the combined voltages and the analog-to-digital converter (ADC), the circuits incorporating digital demodulation, since the front end amplifier and ADC must accommodate both the small modulated signal of interest as well as the large $V_{os}$. By way of example, in order to prevent saturation of a circuit configured to measure magnetic fields of about 60 dB of dynamic range, the circuit may require a design that can process up to 120 dB of linear dynamic range. The additional 60 dB of dynamic range presents a significant penalty in cost and power dissipation. Power consumption is a particular concern with the evolving market of portable low power devices including cell phones.

A Hall effect sensor circuit that reduces sensor offset would be beneficial. A Hall effect circuit which reduces sensor offset while reducing the required dynamic range of front end and backend circuitry would be further beneficial. A Hall sensor which reduces power dissipation and circuit complexity would also be beneficial.

SUMMARY

In accordance with one embodiment, a Hall element sensor circuit includes a Hall element, a Hall element source, a switch matrix operatively connected to the Hall element and the Hall element source to establish a spinning current in the Hall element and to receive a Hall element signal from the Hall element based upon the spinning current, a front end amplifier including a first input operatively connected to a first switch matrix output and a second input operatively connected to a second switch matrix output, and at least one voltage source operatively connected to the front end amplifier at a location in the Hall element sensor circuit between the switch matrix and the front end amplifier.

In accordance with another embodiment, a method for generating a signal based upon a magnetic field includes establishing a first voltage signal based upon an offset voltage associated with a Hall element sensor circuit, generating an output signal from a Hall effect element in the Hall element sensor circuit based upon the magnetic field using a spinning current, modifying the output signal using the established first voltage, and amplifying the modified output signal.

DESCRIPTION

Figure 1:
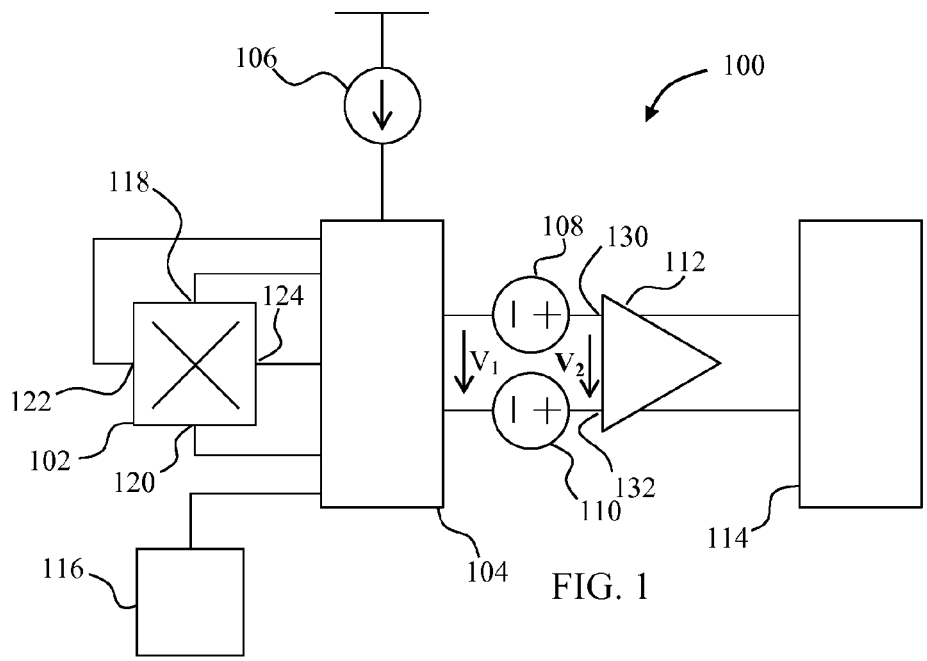
FIG. 1 depicts a schematic view of a Hall element sensor circuit incorporating two voltage sources on the input of a front end amplifier in accordance with principles of the invention.

A Hall Effect sensor circuit 100 depicted in FIG. 1 includes a Hall element 102, a switch matrix 104, and a Hall element source 106. Two cancellation voltage sources 108 and 110 are located between the switch matrix 104 and a front end amplifier 112 which is further connected to backend circuitry 114. A clock generator 116 is also connected to the switch matrix 104.

In general, the Hall effect element 102 produces an output which is applied to the front end amplifier 112. The front end amplifier 112, which may either be a voltage multiplier or a current multiplier, amplifies the received signal by a gain factor and passes the signal on to the backend circuitry 114.

The backend circuitry 114 may include additional amplifiers, analog-to-digital converters, memory, logic, etc.

Figure 2:
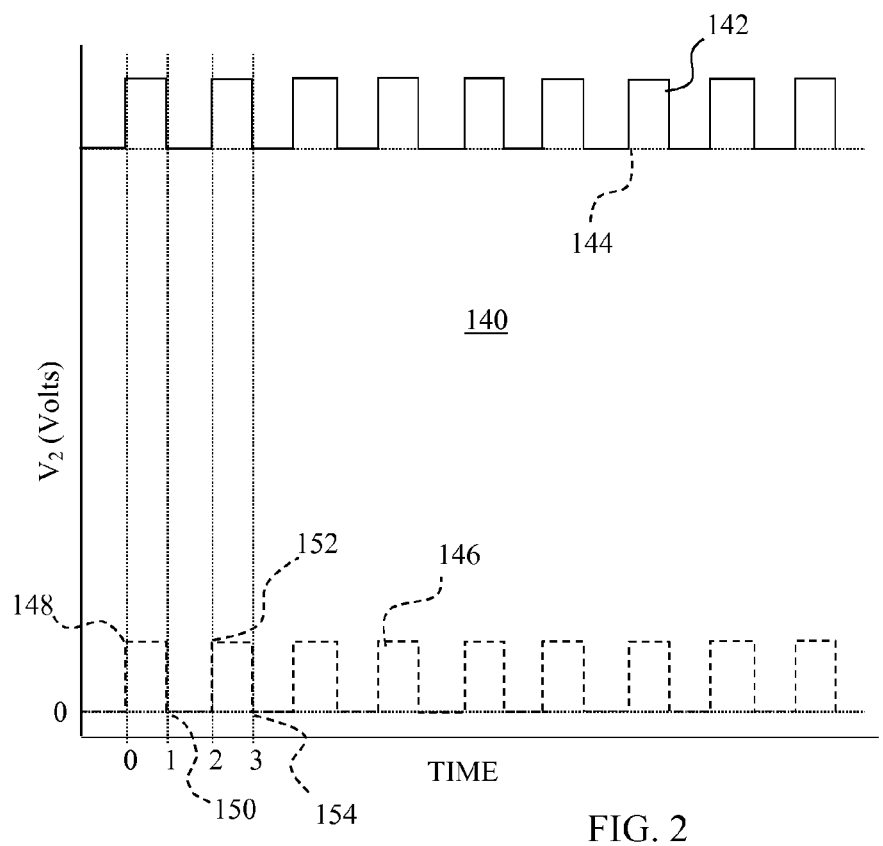
FIG. 2 depicts a graph of the voltage applied to the input of the front end amplifier of FIG. 1 including a DC offset voltage and an AC Hall element signal when the two voltage sources are not used to modify the DC offset voltage.

The operation of the Hall Effect sensor circuit 100 in the presence of a magnetic field is initially described with reference to FIG. 2. FIG. 2 depicts a graph 140 of the $V_2$ 142 over time for operation of the Hall effect sensor circuit 100 in the presence of a magnetic field with both $V_{c1}$ and $V_{c2}$ set to zero. As depicted in FIG. 2, the $V_2$ 142 is a summation of a $V_{os}$ 144 and a $V_h$ 146. The $V_{os}$ 144 is a substantially constant DC value. The time varying characteristic of the $V_h$ 146 is a result of the spinning current technique effected by the clock generator 116.

The spinning current is effected by controlling the switch matrix 104 through a sequence of four different configurations. Thus, the Hall element source 106, which may be a voltage source or a current source, is switchably connected to opposing contacts or nodes of the Hall element 102 by the switch matrix 104 under control of the clock generator 116. By way of example, the Hall element 102, which may consist of a parallel connection of several individual Hall elements, includes contacts 118, 120, 122, and 124. Thus, in a first configuration, the switch matrix 104 may connect the Hall element source 106 as an input to the contact 118 with the contact 120 connected as an output. In one embodiment, the contact 120 is connected to ground.

In this first configuration, the switch matrix 104 under the control of the clock generator 116 further connects the contact 122 to an input 130 of the front end amplifier 112 through the cancellation voltage source 108. Additionally, the switch matrix 104 under the control of the clock generator 116 connects the contact 124 to an input 132 of the front end amplifier 112 through the cancellation voltage source 110. For purpose of this example, the first configuration results in a maximum $V_h$ 148 (see FIG. 2) when the Hall effect source 106 is applied to the contact 118.

In the second configuration, the switch matrix 104 configures the Hall effect source 106 as an input to the contact 122, with the contact 124 as the output. At the same time, the switch matrix 104 configures the output of contact 118 to supply the input 130 while the contact 120 supplies the input 132.

In the second configuration, the current flowing through the Hall element 102 is rotated by ninety degrees with respect to the current direction of the first configuration. Accordingly, for the same magnetic field direction providing a maximum $V_h$ for the first configuration, the second configuration will misalign the current flow with respect to the magnetic field resulting in a $V_h$ 150 of zero.

The switch matrix 104 then switches to a third configuration wherein the Hall effect source 106 is an input to the contact 120, with the contact 118 connected as the output. At the same time, the switch matrix 104 configures the output of contact 124 to supply the input 132 while the contact 122 supplies the input 130.

In the third configuration, the current flowing through the Hall element 102 is rotated by ninety degrees with respect to the current direction of the second configuration, and is rotated one hundred and eighty degrees with respect to the current of the first configuration. Additionally, the inputs supplied by the contacts 122 and 124 in the third configuration (130 and 132, respectively) are the same as the inputs supplied in the first configuration. Accordingly, for the same magnetic field direction providing a maximum $V_h$ for the first configuration, the third configuration results in a $V_h$ 152 that is equal to the $V_h$ 148.

In the fourth and, in this example, final configuration, the current flowing through the Hall element 102 is rotated by ninety degrees with respect to the current direction of the third configuration, and is rotated one hundred and eighty degrees with respect to the current of the second configuration. Additionally, the inputs supplied by the contacts 118 and 120 in the fourth configuration (130 and 132, respectively) are the same as the inputs supplied in the second configuration. The resulting $V_h$ 154 of the fourth configuration in this example is zero.

Accordingly, the $V_{os}$ is a DC bias upon which the signal of interest, $V_h$, is carried. The provision of the cancellation voltage sources 108 and 110 between the switch matrix 104 and the front end amplifier 112 allows for the voltage bias applied to the front end amplifier 112 to be reduced without reducing the ability to detect and quantify the $V_h$. Specifically, at the output of the switch matrix 104, the voltage $V_1$ is represented by the equation below:

$$V_1 = V_{os} + V_h$$

By applying a voltage with the cancellation voltage sources 108 ($V_{c1}$) and 110 ($V_{c1}$), the voltage at the inputs 130 and 132 of the front end amplifier 112 is represented by the equation below:

$$V_2 = V_{os} + V_h + V_{c1} + V_{c2}$$

Accordingly, by establishing the combined voltage of the cancellation voltage sources 108 and 110 to be equal but opposite to the $V_{os}$, plus or minus the amplitude of the $V_h$, the maximum range of voltage applied to the inputs 130 and 132 is the amplitude of the $V_h$. One procedure 160 for establishing the combined voltage ($V_c$) is depicted in FIG. 3.

Figure 3:
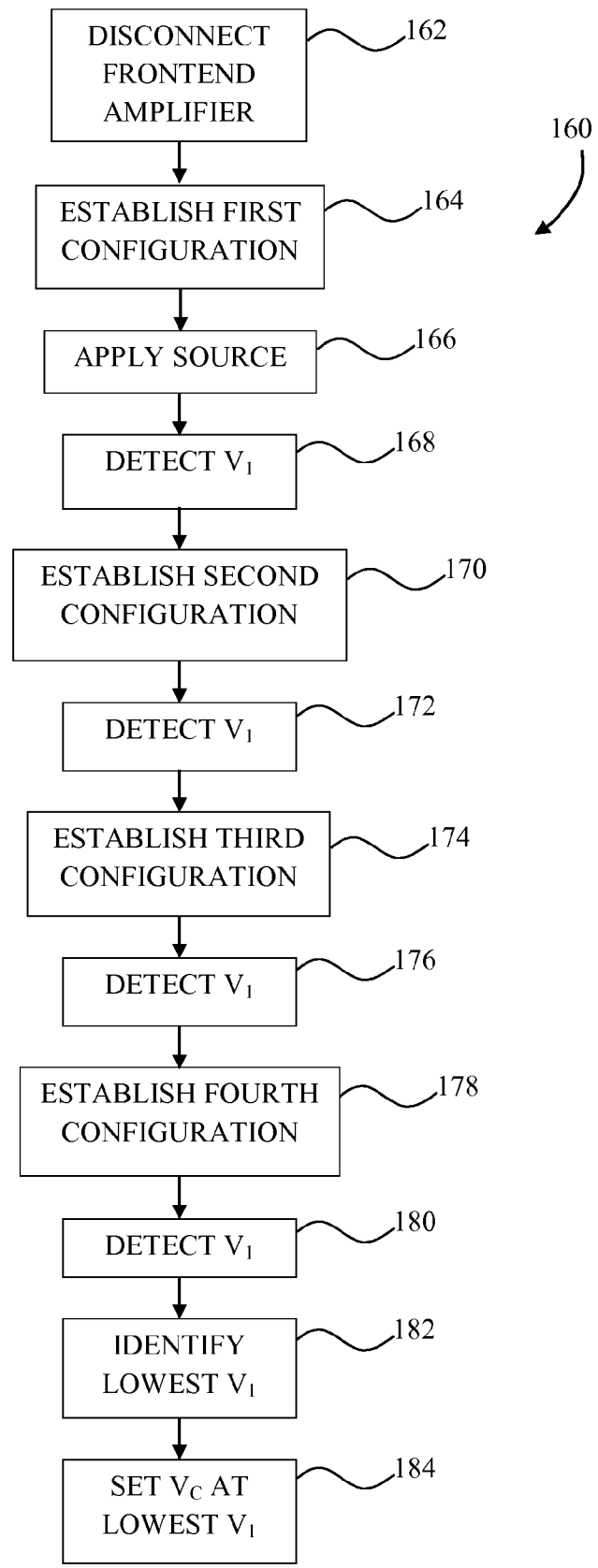
FIG. 3 depicts a procedure that may be used to establish a combined voltage for the two voltage source of FIG. 1 to modify the voltage applied to the input of the front end amplifier of FIG. 1.

In FIG. 3, the front end amplifier 112 is disconnected at block 162. The clock generator 116 then controls the switch matrix 104 to establish a first configuration (block 164). The first configuration may be, for example, the first configuration described above with respect to FIG. 2. The Hall element source 106 is then applied to the Hall element 102 through the switch matrix 104 (block 166) and the resulting $V_1$ is measured and stored (block 168).

The clock generator 116 then controls the switch matrix 104 to establish a second configuration (block 170). The second configuration may be, for example, the second configuration described above with respect to FIG. 2. The resulting $V_1$ is measured and stored (block 172).

The clock generator 116 then controls the switch matrix 104 to establish a third configuration (block 174). The third configuration may be, for example, the third configuration described above with respect to FIG. 2. The resulting $V_1$ is measured and stored (block 176).

The clock generator 116 then controls the switch matrix 104 to establish a fourth configuration (block 178). The fourth configuration may be, for example, the fourth configuration described above with respect to FIG. 2. The resulting $V_1$ is measured and stored (block 180).

Figure 4:
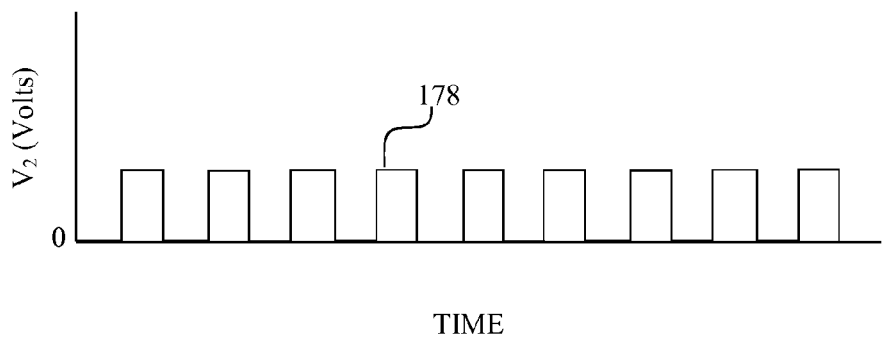
FIG. 4 depicts a graph of the voltage applied to the input of the front end amplifier of FIG. 1 when a combined voltage for the two voltage source of FIG. 1 is used to modify the voltage applied to the input of the front end amplifier of FIG. 1.

At block 182, the lowest detected voltage is identified and at block 184, the compensation voltage sources 108 and 110 are configured to provide a voltage equal to the lowest $V_1$ and with a reverse polarity to the lowest identified $V_1$. When the Hall effect sensor circuit 100 is then operated in the presence of a magnetic field, the resulting $V_2$ is depicted in FIG. 4 wherein the $V_2$ 188 varies from a low of about zero voltage.

The procedure 160 may be modified for a\various applications. By way of example, during initial construction of a Hall element sensor circuit, the $V_c$ may be defined prior to placing a front end amplifier in the system. Additionally, the procedure 160 may be performed in an area devoid of external magnetic fields. Accordingly, a single $V_1$ measurement may be used to identify a desired $V_c$. Similarly, in instances wherein variation need not be initiated from a substantially zero voltage, a single $V_1$ measurement may also be used. The effect of such a modification is simply to establish the $V_c$ at a value somewhere within the range of voltages defined, for example, by the $V_2$ 142 of FIG. 2. Furthermore, while the procedure 160 was performed using a Hall element 102 with four configurations, the procedure may be modified to be used with Hall elements of more or fewer connections.

Figure 5:
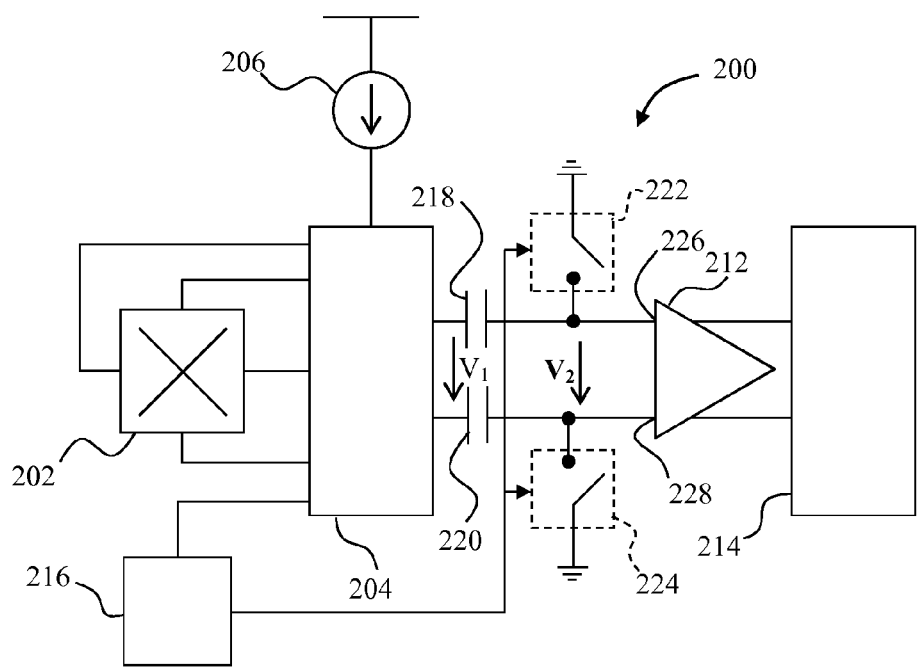
FIG. 5 depicts the Hall element sensor circuit of FIG. 1 wherein the two voltage sources are capacitors operatively connected to the inputs of the front end amplifier and two switches controlled by the clock signal generator selectively connect the inputs of the front end amplifier to ground.

The Hall effect sensor circuit 100 may be implemented in a number of ways as well. One such implementation is depicted in FIG. 5. Hall effect sensor circuit 200 depicted in FIG. 5 includes a Hall element 202, a switch matrix 204, and a Hall element source 206. The Hall effect sensor circuit 200 further includes a front end amplifier 212 which is further connected to backend circuitry 214. A clock generator 216 is also connected to the switch matrix 204.

In the Hall effect sensor circuit 200, the cancellation voltage sources are embodied as a pair of capacitors 218 and 220 along with two switches 222 and 224 which are switchably controlled by the clock generator 216 to connect the inputs 226 and 228 of the front end amplifier 212 to ground.

The Hall effect sensor circuit 200 may be operated by modification of the procedure 160. Specifically, rather than disconnecting the front end amplifier 112 at block 162, the switch 222 is controlled to connect the input 226 to ground while the switch 224 is controlled to connect the input 228 to ground. This allows the voltage at the input to the front end amplifier 112 to go to zero. Once the voltage is at zero, the switches 222 and 224 are deactivated and a first switch configuration is established at block 164 which allows the capacitors 218 and 220 to sample $V_1$ to establish the desired cancellation voltage to reduce or cancel the $V_{os}$. The Hall effect sensor circuit 200 is then operated in a normal mode by establishing a spinning current as described above. The capacitors 218 and 220 cancel or reduce the $V_{os}$ and only the AC signal caused by the time varying $V_h$ is passed to the inputs 226 and 228.

Figure 6:
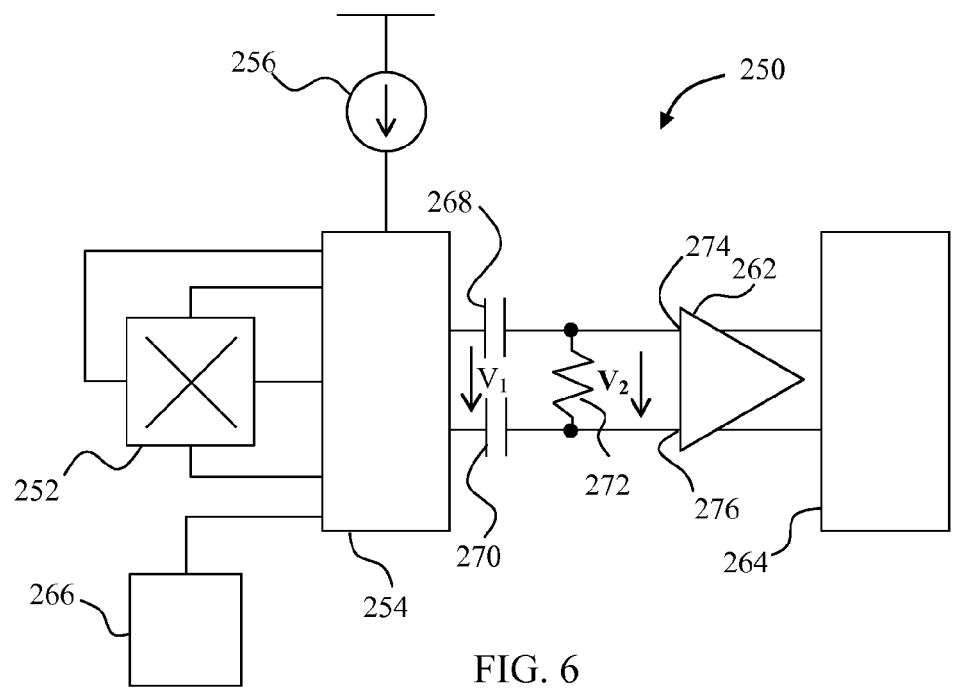
FIG. 6 depicts the Hall element sensor circuit of FIG. 1 wherein the two voltage sources are capacitors operatively connected to the inputs of the front end amplifier and the inputs of the front end amplifier are connected through a resistor.

A further embodiment of a Hall effect sensor circuit 250 is depicted in FIG. 6 and includes a Hall element 252, a switch matrix 254, and a Hall element source 256. The Hall effect sensor circuit 250 further includes a front end amplifier 262 which is further connected to backend circuitry 264. A clock generator 266 is also connected to the switch matrix 254.

In the Hall effect sensor circuit 250, the cancellation voltage sources are embodied as a pair of capacitors 268 and 270 along with a resistor 272 which is connected between the inputs 274 and 276 of the front end amplifier 262. The resistor 272 forces the time average value of the voltage at the inputs 274 and 276 to zero. The R-C constant formed by the combination of the resistor 272 and the capacitors 268 and 270 is selected to be much larger than the period of the spinning current to minimize the effect of the time constant on the modulated signal.

Figure 7:
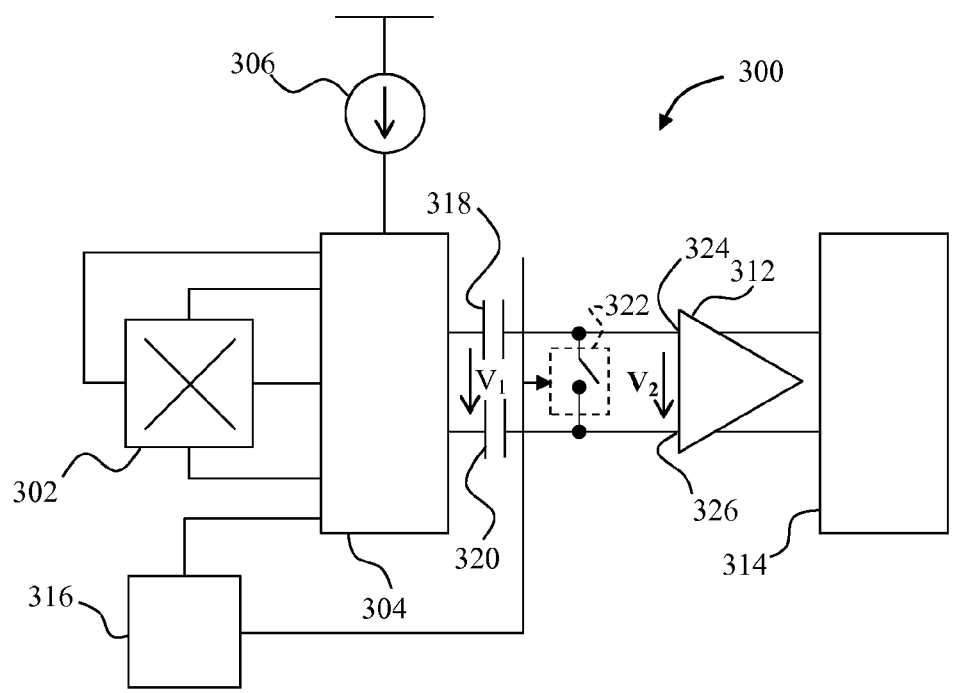
FIG. 7 depicts the Hall element sensor circuit of FIG. 1 wherein the two voltage sources are capacitors operatively connected to the inputs of the front end amplifier and a switch controlled by the clock signal generator selectively connects the inputs of the front end amplifier.

A further embodiment of a Hall effect sensor circuit 300 is depicted in FIG. 7 and includes a Hall element 302, a switch matrix 304, and a Hall element source 306. The Hall effect sensor circuit 300 further includes a front end amplifier 312 which is further connected to backend circuitry 314. A clock generator 316 is also connected to the switch matrix 304.

In the Hall effect sensor circuit 300, the cancellation voltage sources are embodied as a pair of capacitors 318 and 320 along with a switch 322 which is connected between the inputs 324 and 326 of the front end amplifier 312. The switch 322 provides the same function as the switches 222 and 224 in the embodiment of FIG. 5.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A Hall element sensor circuit comprising:
    a Hall element;
    a Hall element source;
    a switch matrix operatively connected to the Hall element and the Hall element source to establish a spinning current in the Hall element and to receive a Hall element signal from the Hall element based upon the spinning current;
    a front end amplifier including a first input operatively connected to a first switch matrix output and a second input operatively connected to a second switch matrix output;
    at least one voltage source operatively connected to the front end amplifier at a location in the Hall element sensor circuit between the switch matrix and the front end amplifier; and
    a clock signal generator operatively coupled to the switch matrix and configured to control the switch matrix to establish the spinning current, wherein:
    the sensor circuit further comprises a switch having a first position whereat the first input of the amplifier is electrically connected to the second input of the amplifier by the switch, and a second position whereat the first input of the amplifier is not electrically connected to the second input of the amplifier by the switch; and
    the clock signal generator is operably connected to the switch to control the switch between the first and second positions.

2. The sensor circuit of claim 1, wherein the at least one voltage source comprises:
    a first capacitor electrically connected to the first input of the amplifier; and
    a second capacitor electrically coupled to a second input of the amplifier.

3. A Hall element sensor circuit comprising:
    a Hall element;
    a Hall element source;
    a switch matrix operatively connected to the Hall element and the Hall element source to establish a spinning current in the Hall element and to receive a Hall element signal from the Hall element based upon the spinning current;
    a front end amplifier including a first input operatively connected to a first switch matrix output and a second input operatively connected to a second switch matrix output;
    at least one voltage source operatively connected to the front end amplifier at a location in the Hall element sensor circuit between the switch matrix and the front end amplifier; and
    a clock signal generator operatively coupled to the switch matrix and configured to control the switch matrix to establish the spinning current,
    a first switch having a first position whereat the first input of the amplifier is electrically connected to ground by the first switch, and a second position whereat the first input of the amplifier is not electrically connected to ground by the first switch; and
    a second switch having a third position whereat the second input of the amplifier is electrically connected to ground by the second switch, and a fourth position whereat the second input of the amplifier is not electrically connected to ground by the second switch, wherein the clock signal generator is operably connected to the first switch to control the first switch between the first and second positions, and the clock signal generator is operably connected to the second switch to control the second switch between the third and fourth positions.

4. The sensor circuit of claim 3, wherein the at least one voltage source comprises:

a first capacitor electrically connected to the first input of the amplifier; and a second capacitor electrically coupled to a second input of the amplifier.

5. A Hall element sensor circuit comprising:

a Hall element;

a Hall element source;

a switch matrix operatively connected to the Hall element and the Hall element source to establish a spinning current in the Hall element and to receive a Hall element signal from the Hall element based upon the spinning current;

a front end amplifier including a first input operatively connected to a first switch matrix output and a second input operatively connected to a second switch matrix output; and at least one voltage source operatively connected to the front end amplifier at a location in the Hall element sensor circuit between the switch matrix and the front end amplifier, wherein the at least one voltage source comprises:

a first capacitor electrically connected to the first input of the amplifier;

a second capacitor electrically coupled to a second input of the amplifier; and a resistor electrically coupled to the first input of the amplifier and to the second input of the amplifier.

6. The sensor circuit of claim 5, further comprising:

a clock signal generator operatively coupled to the switch matrix and configured to control the switch matrix to establish the spinning current.

7. The sensor circuit of claim 6, wherein the Hall element source is an electrical current source.

8. The sensor circuit of claim 6, wherein the Hall element source is an electrical voltage source.

9. The sensor circuit of claim 6, wherein the clock generator is configured to control the switch matrix through a sequence of configurations such that a contact of the Hall element is sequentially operatively connected to the Hall element source, the first input, ground, and the second input.

10. A method for generating a signal based upon a magnetic field comprising:

establishing a first voltage signal based upon an offset voltage associated with a Hall element sensor circuit;

generating an output signal from a Hall effect element in the Hall element sensor circuit based upon a magnetic field using a spinning current;

modifying the output signal using the established first voltage; and amplifying the modified output signal, wherein establishing a first voltage signal comprises:

connecting a first input of a front end amplifier to ground using a first switch;

connecting a second input of the front end amplifier to ground using a second switch;

charging a first capacitor operatively connected to a switch matrix and to the first switch with the Hall effect element; and charging a second capacitor operatively connected to the switch matrix and to the second switch with the Hall effect element.

11. The method of claim 10, wherein establishing a first voltage signal comprises:

charging a first capacitor operatively connected to a switch matrix and to a first input of a front end amplifier; and charging a second capacitor operatively connected to the switch matrix and to a second input of the front end amplifier, wherein a resistor is operatively connected at a first end to the first capacitor and to the first input, and the resistor is operatively connected at a second end to the second capacitor and to the second input.

12. The method of claim 10, wherein the resistor, the first capacitor, and the second capacitor define an R-C constant, the R-C constant larger than a period defined by the spinning current.

13. A method for generating a signal based upon a magnetic field comprising:

establishing a first voltage signal based upon an offset voltage associated with a Hall element sensor circuit;

generating an output signal from a Hall effect element in the Hall element sensor circuit based upon a magnetic field using a spinning current;

modifying the output signal using the established first voltage; and amplifying the modified output signal, wherein establishing a first voltage signal comprises:

switchably connecting a first input of a front end amplifier to a second input of the front end amplifier;

charging a first capacitor operatively connected to a switch matrix and to the first input with the Hall effect element; and charging a second capacitor operatively connected to the switch matrix and to the second input with the Hall effect element.

* * * * *